(12) United States Patent
Viens et al.

(10) Patent No.: US 6,966,019 B2
(45) Date of Patent: Nov. 15, 2005

(54) INSTRUMENT INITIATED COMMUNICATION FOR AUTOMATIC TEST EQUIPMENT

(75) Inventors: Dominic Viens, Milford, MA (US); Gregory P. Brown, Cambridge, MA (US); Larry Klein, Newton, MA (US); Francois Labonte, Palo Alto, CA (US)

(73) Assignee: Teradyne, Inc., Boston, MA (US)

( * ) Notice: Subject to any disclaimer, the term of this patent is extended or adjusted under 35 U.S.C. 154(b) by 639 days.

(21) Appl. No.: 10/186,195

(22) Filed: Jun. 28, 2002

(65) Prior Publication Data

US 2004/0003328 A1 Jan. 1, 2004

(51) Int. Cl.[7] .............................................. G01R 31/317
(52) U.S. Cl. .................................... 714/724; 716/4
(58) Field of Search ............................. 714/724; 716/4; G01R 31/317

(56) References Cited

U.S. PATENT DOCUMENTS

| | | | |
|---|---|---|---|
| 4,402,055 A | 8/1983 | Lloyd et al. ............... 364/579 |
| 5,361,336 A | 11/1994 | Atchison .................... 395/275 |
| 5,673,272 A | 9/1997 | Proskauer et al. ......... 371/22.1 |
| 6,031,349 A | * 2/2000 | Hard et al. .................. 318/466 |
| 6,107,818 A | 8/2000 | Czamara ..................... 324/765 |
| 6,265,842 B1 | * 7/2001 | Hard et al. .................. 318/466 |
| 6,400,173 B1 | * 6/2002 | Shimizu et al. ............. 324/765 |
| 6,727,723 B2 | * 4/2004 | Shimizu et al. ............. 324/765 |

FOREIGN PATENT DOCUMENTS

EP          0 939 321          9/1999          ......... G01R/31/319

OTHER PUBLICATIONS

Mehtani, et al. "MixTest: A Mixed–Signal Extension to a Digital Test Sytem" IEEE, Paper 42.4, pp. 945–953, 1993.

* cited by examiner

*Primary Examiner*—R. Stephen Dildine

(57) ABSTRACT

An automatic test system transfers measure data from one or more test instruments to a processor and processes the measure data, the packaging, transfer, and the processing of the measure data initiated by the one or more test instruments. A method for testing a device under test includes capturing measure data with a test instrument, and initiating, with the test instrument, operation upon the measure data. The operations include packaging the measure data to provide packaged data, and transferring the packaged data to a switching/processing circuit for processing. A method of manufacturing an electronic circuit includes fabricating the electronic circuit and testing the electronic circuit with the aforementioned method.

20 Claims, 5 Drawing Sheets

INSTRUMENT INITIATED COMMUNICATION FOR AUTOMATIC TEST EQUIPMENT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to automatic test equipment (ATE) used to test electronic circuits.

BACKGROUND OF THE INVENTION

As is know in the art, some automatic test equipment (ATE) is adapted to electrically test integrated circuits at the wafer stage of integrated circuit (IC) fabrication and/or at the packaged IC stage. The circuit being tested is often referred to as a device under test (DUT). So-called, "handling equipment" physically manipulates the DUTs to provide a coupling between the DUTs and the ATE. For example, in one type of system, handling equipment provides a rapid feed of packaged ICs, sequentially coupling each IC to the ATE. In another system, the handling equipment utilizes step and repeat miniature probes that couple the ATE to individual IC dies on a wafer, thereby allowing the dies to be sequentially tested by the ATE.

As is also known, to keep the cost of IC's low and to meet the supply requirements of IC users, there has been a trend to reduce the amount of time required by the ATE to test an IC. To help address the IC cost and supply issues, state-of-the-art ATE systems typically include a host computer coupled to one or more test instruments. Each of the one or more test instruments is typically coupled to a moveable test head. The host computer can be a personal computer, a workstation, or any digital computing platform. The one or more test instruments, responsive to the host computer can include both generic test equipment, for example a conventional voltmeter, and also specialized test equipment integrated with the ATE, for example a digital pattern generator. Under control of the host computer and a test program associated therewith, the one or more test instruments can receive signals from and provide signals to a DUT through THE test head. The test head includes a group of test pins typically referred to as a "pin field." The pin field includes one or more pins, (e.g. so-called pogo pins) through which the one or more test instruments are coupled to one or more DUTs provided by the handling equipment.

The one or more test instruments can provide one or more "source signals" to respective pins within the pin field. The source signals may include, for example, one or more analog signals or one or more digital signals or a combination of one or more analog signals and one or more digital signals. The source signals are this coupled through the pin field to the DUT.

The one or more test instruments can also receive "measure signals" from the DUTs through respective pins within the pin field. The measure signals may include, for example, one or more analog signals or one or more digital signals or a combination of one or more analog signals and one or more digital signals. The measure signals are coupled to the one or more test instruments from the DUT through the pin field. Thus, the ATE, in conjunction with the handling equipment, can provide signals to and receive signals from either dies upon a wafer or packaged ICs.

A source signal, whether analog or digital, can be represented as "source data." In providing a source signal, it is often necessary to transfer the "source data" that corresponds to the source signal from the host computer to the one or more test instruments. The source data can correspond, for example, to digital samples of a sine wave. The source data is transferred to one or more of the test instruments and used by the test instruments to provide the source signals. It should be appreciated that there can be a large amount of source data.

Similarly, a measure signal, whether analog or digital, can be represented as digital samples referred to as "measure data." The measure signals are typically converted to "measure data" by the test instrument. It is often necessary to transfer the measure data from the test instrument to the host computer. It should be appreciated that there can be a relatively large amount of measure data.

The host computer executes a test program that includes instructions for setup and control of the test instruments, instructions for generation of the source data, instructions for transfer of the source data to the test instrument, instructions for capture of the measure data received from the DUT, instructions for transfer of the measure data to the host computer, instructions for processing the measure data to generate "processed data," and instructions to process the processed data to generate "binned data." Processed and binned data are described below.

Each of the above instructions can be categorized according to function categories associated with the test program, the function categories including a) setup, b) execution, c) data move, d) processing, and e) binning. It should be noted that a conventional test program can include instructions corresponding to each of these function categories. It will also be noted that each different test program takes a different amount of time to setup, execute, data move, process and bin.

Of the above instructions, the instructions for setup and control of the test instruments, the instructions for generation of the source data, and the instructions for transfer of the source data to the test instrument, each correspond to the setup function category. Each of these instructions are generally provided only once at the beginning of the test program.

The instructions for capture of the measure signals are associated with acquisition of data by the test instrument, the time duration of which is determined by the characteristics of the test instrument. The instructions for capture of measure signals, associated with the execution function category, are generally repeated a number of times within the test program.

The instructions for transfer of the measure data to the host computer, associated with the data move function category, also are generally repeated a number of times within the test program.

The instructions for processing of the measure signals to generate the processed data, associated with the processing function category, also are generally repeated a number of times within the test program.

The instructions for processing the processed data to generate binned data, associated with the binning function category, are generally provided only once at the end of the test program. The data processing and the binning operations are often performed by the host computer.

The execution time (or "run time") of a test program which implements one individual test on an IC is typically about several seconds. It is often necessary, however, to perform hundreds or thousands of individual tests on each IC. For a particular test program, any one or more of the function categories described above can dominate the total amount of testing time associated with the test program. However, the lengthiest time durations are often those associated with functions that must be repeated a number of times within the test program, rather than with those functions that are performed only one time per test program. As described above, the instructions associated with the execution, data move, and processing function categories are typically repeated a number of times within the test program. Thus, the processes carried out in these function categories are often associated with the longest time durations of the test program.

The time durations associated with the above-mentioned execution function category are influenced by a variety of factors, including but not limited to, the test instrument acquisition speed and the number of measure samples required for a particular test. For example, the test instrument can be a high speed digital signal capture instrument that can capture 8 digital states (one byte) in parallel at a rate of 100 Mbytes per second having a total number of captured bytes of 256,000. This capture would take 0.256 milliseconds. If this data capture were repeated a number of times in the test program, a large amount of time could be devoted to the data capture.

The time durations associated with the above-mentioned data move function category are also influenced by a variety of factors, including, but not limited to, the amount of measure data to be transferred and the speed of the data bus upon which the transfer is done. For example, a transfer of one thousand digital bytes can be associated with an instruction for transfer of measure data, and the measure data can be transferred on a one bit wide serial bus having a bus speed of 10 Mbits per second. In this example, the data transfer would take 0.8 milliseconds. If this data transfer were repeated a number of times in the test program, a large amount of time could be devoted to the transfer of measure data.

The time durations associated with the above-mentioned processing function category are also influenced by a variety of factors, including, but not limited to, the type of processing, the processing speed of the processor that performs the processing, and the amount of data to process. For example, the processing can be a fast Fourier transform performed on one thousand measure samples with a personal computer.

With regard to the above-mentioned data move function category, ATE is often configured having a single data bus coupled between the host computer and the one or more test instruments. Often, the single data bus is a relatively slow data bus. Thus, in many ATE, the time duration associated with the instructions for transfer of measure data from the one or more test instruments to the host computer often has the longest duration. Furthermore, the test program, upon reaching an instruction requesting the transfer of the measure data, must wait until the measure data transfer is completed before proceeding to the next test program instruction.

With regard to the above-mentioned processing function category, the measure data is often processed with functions, for example FFTs, which are most rapidly performed using floating-point arithmetic. Many ATE systems are provided having a host computer that is not optimized to perform floating-point arithmetic on the measure data.

It would, therefore, be desirable to increase the speed with which an ATE system can test a DUT. It would also be desirable to reduce the amount of time required to transfer the measure data from the DUT to the host computer. It would also be desirable to provide an ATE system that can rapidly process measure data.

SUMMARY OF THE INVENTION

In accordance with an embodiment of the present invention, a circuit testing apparatus includes at least one test instrument and a bus master circuit coupled to the at least one test instrument. With this particular arrangement, an ATE system is provided which automatically transfers measure data from the one or more test instruments to a processor. One or more bus master circuits are adapted to receive measure data from respective ones of the at least one test instruments. Upon initiation from one of the at least one test instruments, the respective bus master circuit packages the measure data in accordance with a predetermined protocol to provide packaged data and transfers the packaged data to a switching/processing circuit. The switching/processing circuit is adapted to receive the packaged data and to process the packaged data to provide processed data and to communicate the processed data to a host computer. In this manner, the test program need not provide instructions for the transfer of measure data nor wait for the transfer to complete before proceeding. Thus the circuit testing apparatus can test circuits relatively rapidly.

In accordance with another aspect of the present invention, a circuit testing method includes capturing measure data in a test instrument, the measure data generated in response to the test instrument implementing one or more tests to an electronic circuit. The method also includes initiating, with the test instrument, operations upon the measure data. The operations include packaging the measure data with a bus master circuit to provide packaged data having a data packet and a data header. The operations also include transferring the packaged data to a switching/processing circuit, routing the packaged data with the switching/processing circuit to a processor, and processing the packaged data with the processor to provide processed data. The processing is responsive to the data header.

With this particular arrangement, a technique for reducing the amount of time required to test a circuit is provided. By initiating, within the test instrument, the packaging and the transfer of the measure data to a processor, the time required to transfer and to process the measure data is eliminated from the host computer flow of operations.

In accordance with another aspect of the present invention, a method of manufacturing an electronic circuit includes fabricating an integrated circuit and testing the integrated circuit with a circuit testing apparatus by capturing, in a test instrument, measure data provided by the electronic circuit, and initiating, with the test instrument, operations upon the measure data. The operations include packaging the measure data with a bus master circuit to provide packaged data having a data packet and a data header. The operations also include transferring the packaged data to a switching/processing circuit, routing the packaged data with the switching/processing circuit to a processor, and processing the packaged data with the processor to provide processed data. The processing is responsive to the data header.

With this particular arrangement, a method of rapidly manufacturing an electronic circuit is provided. By initiating, within the test instrument, the packaging and the transfer of the measure data to a processor, the time required to manufacture the electronic circuit is reduced.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the instrument initiated moves and instrument initiated processing in accordance with the present invention, some introductory concepts and terminology are explained. The terms "ATE" and "tester," as used herein, are used to describe automatic test equipment that can be used to electrically test a device under test (DUT). The DUT can be an electronic system, an integrated circuit (IC), a discrete circuit, for example a transistor, a populated circuit board, or a bare circuit board. Many examples used herein refer to an ATE that is used to test an IC. However, it will be understood that the concepts described herein apply equally well to an ATE used to test any of the aforementioned DUTs.

The term "source signal" as used herein, refers to a signal applied to the DUT. The same signal may be provided as any type of signal including but not limited to an electrical signal, an electronic signal, a radio frequency (RF) signal or an optical signal. The source signal can be either an analog source signal or a digital source signal. The source signal is often a sampled signal constructed from "source data." The source data may be provided, for example, as digital samples of a sine wave. Through a digital-to-analog (D/A) converter, the source data can be used to generate a source signal sine wave. For another example, the source data can be digital bits and, through a buffer and/or a level translator, the source data can be used to generate a source digital waveform.

The term "measure signal," as used herein, refers to a signal provided by the DUT in response to one or more source signals. The measure signal can be either an analog measure signal or a digital measure signal. An analog measure signal can be digitally sampled with an analog-to-digital (A/D) converter or the like and converted into "measure data." A digital measure signal can be constructed into digital bytes, the digital bytes corresponding to the measure data.

Figure 1:
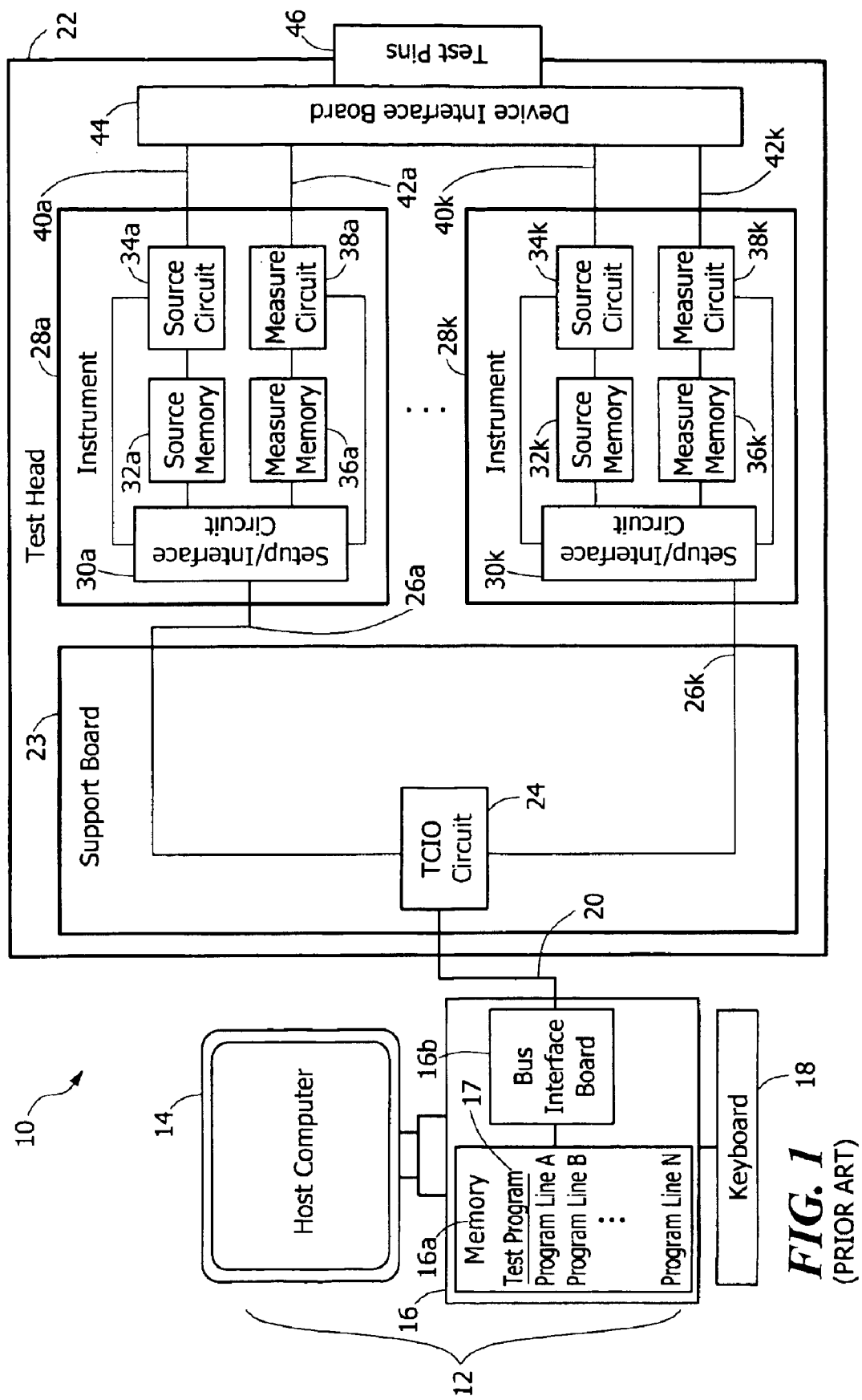
FIG. 1 is a block diagram of a prior art automatic test equipment (ATE)

Referring now to FIG. 1, an exemplary embodiment of a prior art tester 10 includes a host computer 12. The host computer 12 can be a personal computer (PC), a workstation, or any computing platform. The host computer 12 includes a display 14, a processing portion 16 and a keyboard 18. The processing portion 16 includes a program memory 16a having stored therein test program code 17 executable by the processing portion 16. The host computer 12 also includes a bus interface circuit board 16b.

Through the bus interface circuit board 16b, the test program 17 communicates with a test head 22 through a test computer input/output (TCIO) bus 20. The test head 22 includes a support circuit board 23 including a TCIO circuit 24. The TCIO circuit 24 is coupled to the TCIO bus 20. The TCIO circuit 24 is also coupled to one or more test instruments 28a–28k through respective test instrument busses 26a–26k. While eleven test instruments 28a–28k, associated with eleven respective test instrument busses 26a–26k are here shown, it should be appreciated that any number of test instruments and associated test instrument busses can be used.

Taking the test instrument 28a as representative of all such test instruments 28a–28k, the test instrument 28a includes a setup/interface circuit 30a coupled to both a source memory 32a and to a source circuit 34a. The source memory 32a is also coupled to the source circuit 34a. The source memory 32a is a storage resource in which source data generated by the test program 17 can be stored. The source data, described above, is provided to the source circuit 34a and is used to generate a source signal 40a. The source signal 40a is coupled to a device interface board 44 that is further coupled to a group of test pins 46, also called a pin field 46. The device interface board 44 provides connection switching of the source signal 40a to one or more of the test pins 46. The test pins 46 are coupled to a DUT (not shown). The source signal 40a can be an analog or digital source signal, or a combination of an analog and a digital source signal.

The test pins 46 and the device interface board 44 coupled thereto are also coupled to a measure circuit 38a. The measure circuit 38a is coupled to a measure memory 36a, and both the measure circuit 38a and the measure memory 36a are coupled to the setup/interface circuit 30a. In response to a source signal, the DUT provides one or more measure signals 42a through the test pins 46 to the measure circuit 38a. The one or more measure signals 42a can be analog or digital measure signals, or a combination of an analog and a digital measure signals. The measure circuit 38a converts the one or more measure signals 42a to measure data which are stored in the measure memory 36a.

As described above, the host computer 12 runs the test program 17 that includes instructions for setup and control of the test instruments 28a–28k, instructions for generation of the source data, instructions for transfer of the source data to the test instruments 28a–28k, instructions for capture of the measure data in the measure memory 36a–36k, instructions for transfer of the measure data to the host computer 12, instructions for processing the measure data in the host computer 12 to generate "processed data," and instructions to process the processed data in the host computer 12 to generate "binned data." The processed data and the binned data are further described below.

Signals generated by the test program 17 can be transmitted over the TCIO bus 20 and also the test instrument bus 26a. For example, signals corresponding to instructions for setup and control of the test instrument 28a including setup of the source circuit 34a and the measure circuit 38a can be transmitted over the TCIO bus 20 and the test instrument bus 26a. Also, signals corresponding to instructions for transfer of the source data to the source memory 32a, instructions for capture of the measure data in the measure memory 36a, and instructions for transfer of the measure data from the measure memory 36a to the host computer 12, can also be transmitted over the TCIO bus 20 and the test instrument bus 26a. Thus, the TCIO bus 20 and the test instrument bus 26a are bi-directional busses (or functionally equivalent transmission paths) which allow signals to be transmitted in two directions.

In operation, the host computer 12 provides signals corresponding to the instructions for setup and control of the test instrument 28a to the setup/interface circuit 30a. The test instrument 28a is adapted to receive the signals corresponding to instructions for setup and control of the test instrument 28a and to act upon the instructions in a variety of ways, including, but not limited to, setup of D/A converters within the source circuit 34a, setup of amplifier gains within the source circuit 34a, setup of filters within the source circuit 34a, setup of A/D converters within the measure circuit 38a, setup of amplifier gains within the measure circuit 38a, and setup of filters within the measure circuit 38a. The setup can also include setup of timing edge placement of digital source signals.

The signals corresponding to the instructions for transfer of the source data to the test instrument 28a are also provided by the host computer 12 to the setup/interface circuit 30a. These signals can include transfer of source data that can be reconstructed into a sampled analog waveform. For example, the source data can be samples of a sine wave that are converted to a sampled sine wave at the test instrument 28a by a D/A converter or the like. The signals corresponding to the instructions for transfer of the source data to the test instrument 28a can also include instructions for transfer of a source pattern, the source pattern corresponding to a pattern of digital signals that are provided by the test program and stored in the source memory 32a. The source pattern corresponds to a particular desired pattern of digital source signal 40a.

In response to a particular source signal 40a, the DUT (not shown) is expected to provide a particular measure signal 42a associated with processed data having particular pre-determined processed data thresholds. The pre-determined processed data thresholds can include a variety of thresholds, including, but not limited to, magnitude thresholds, timing thresholds, and measured digital pattern thresholds.

Upon receiving the measure signal 42a from the DUT, the measure circuit 38a converts the measure signals to measure data as required for storage in the measure memory 36a. Upon receipt of an instruction from the test program 17 corresponding to a transfer of the measure data from the measure memory 36a, the measure data is transferred on the test instrument bus 26a to the TCIO circuit 24 and further transferred to the host computer 12 on the TCIO bus 20. It should be understood that the measure data is transferred from the measure memory 36a upon initiation from the host program 17. The measure data is then processed by the host computer 12 to provide the processed data. The processed data is then processed by the host computer to provide the binned data.

The host computer 12, by processing the measure data to provide the processed data, and then associating the processed data with the processed data thresholds, generates a pass/fail determination associated with each particular test of the test program 17. The pass/fail determination is referred to herein as "binned data." Since the test program can provide a plurality of tests, a plurality of binned data can be associated with the test program. For example, the measured data can be 1024 measured data values and the measured data can be processed via a fast Fourier transform (FFT), for example, to generate processed data having 512 FFT processed data points. The processed data can be associated with magnitude data thresholds to provide binned data having a single pass or fail value. From this example, it should be appreciated that the amount of processed data is often less than the amount of measured data, and the amount of binned data is often less than the amount of processed data.

In one particular embodiment, the TCIO bus 20 is provided as a serial bus having a bit rate of 100 Mbits per second and the test instrument data bus 26a is provided as a serial data bus having a bit rate of 100 Mbits per second. Thus, 12.5 million 8-bit bytes per second can be carried on each of the two data busses. It will be appreciated that where a test program must transfer millions of measure data words from the test instrument 28a to the host computer 12, the test time can be unacceptably large.

As described above, the host computer 12 executes the test program 17 having a variety of function categories. Also, as described above, a long time duration is often associated with the data move function category, specifically the time duration associated with the instructions for transfer of the measure data to the host computer. In the ATE 10, the measure data is transferred from the measure memory 36a, through the setup/interface circuit 30a, to the test instrument bus 26a, through the TCIO circuit portion 24, to the TCIO bus 20, to the host computer. The test program 17, upon reaching an instruction requesting the transfer of the measure data, must wait until the measure data is transfer is completed before proceeding to the next test program instruction.

While test instruments 28a–28k are shown each having respective source memories 32a–32k source circuits 34a–34k, measure memories 36a–36k, and measure circuits 38a–38k, in an alternate embodiment, one or more of the test instruments have only source memories and source circuits or only measure memories and measure circuits.

Figure 2:
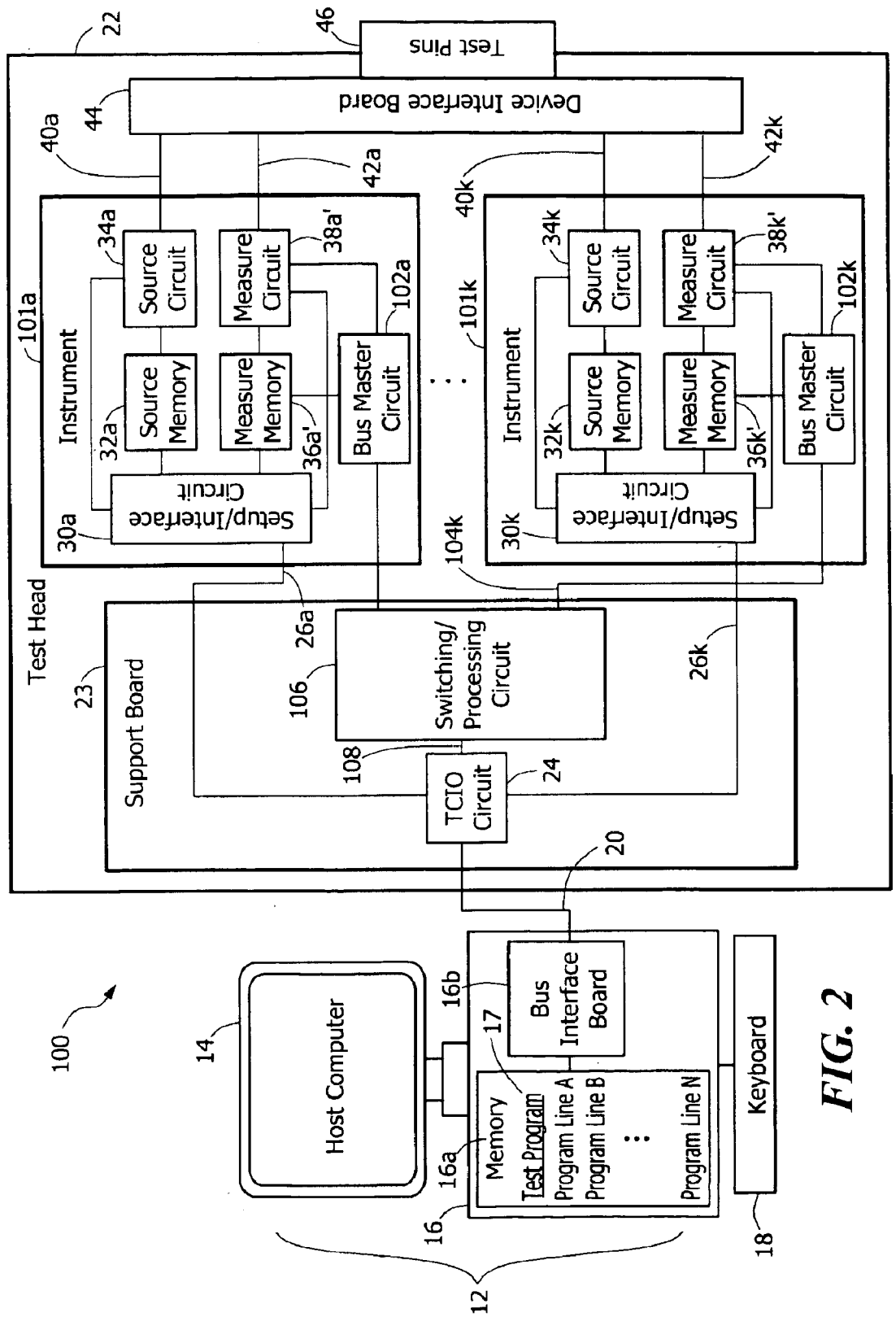
FIG. 2 is a block diagram of an exemplary ATE in accordance with the present invention.

Referring now to FIG. 2, in which like elements of FIG. 1 are provided having like reference designations, an exemplary ATE 100 in accordance with the present invention includes one or more test instruments 101a–101k, each of the test instruments 101a–101k including a bus master circuit 102a–102k. Each of the respective bus master circuits 102a–102k is coupled to a corresponding one of measure memories 36a'–36k' and measure circuits 38a'–38k'. The measure circuits 38a'–38k' receive measure signals 42a–42k from the DUT, converts the measure signals to measure data, and provides the measure data to the measure memories 36a'–36k'. Here, the measure circuits 38a'–38k' and the measure memories 36a'–36k' are distinguished from the measure circuits 38a–38k and the measure memories 36a–36k shown in FIG. 1, since they are provided each having a coupling to respective ones of the bus master circuits 102a–120k mentioned above.

Taking the test instrument 101a as representative of all such test instruments 101a–101k, the bus master circuit 102a receives the measure data from the measure memory 36a'. The bus master circuit formats and transfers the measure data from the measure memory 36a' upon initiation by the measure circuit 38a'. The measure circuit 38a' initiates a transfer once a particular measurement has completed.

In contrast to the prior art ATE of FIG. 1, where the measure data is transferred from the measure memory 36a upon initiation by the test program 17, in accordance with the present invention, the measure circuit 38a' initiates the transfer of data from the memory 36a' to the bus master circuit 102a as well as the transfer of data from the bus master circuit 102a to a switching/processing circuit 106. Thus, since the measure circuit 38a' recognizes when testing is complete, the measure circuit 38a' is able to initiate all further processing of the data.

As described above, in the prior art system of FIG. 1, the test program must wait until the measure data is transferred. In accordance with the present invention, however, the measure data is formatted and transferred by the bus master circuit 102a upon initiation from the measure circuit 38a', and no instruction for the transfer of measure data need be written into the test program. Thus, the test program need not wait for the transfer to complete prior to executing its next instruction.

The bus master circuit 102a formats the measure data to provide formatted data. The formatted data includes a data header and a data packet. The data packet corresponds to the measure data. The data header includes a variety of descriptors including but not limited to descriptors which identify the particular test instrument 101a, the amount of measure data, and the type of processing that is to be performed upon the measure data. Hereafter, the header information corresponding to the type of processing that is to be performed upon the data packet will be referred to as an "extended header descriptor." The particular content of the header is selected in accordance with a variety of factors, including, but not limited to, a desire to minimize the header size so that the formatted data can subsequently be rapidly transferred, as well as the particular application in which the ATE is being used.

While the bus master circuits 102a–102k are shown in this exemplary embodiment to be part of the test instruments 101a–101k, it should be apparent that all or part of the bus master circuits 102a–102k can be provided apart from the test instruments 101a–101k.

The formatted data is transferred by the bus master circuit 102a through a move data bus 104a to the switching/processing circuit 106. The switching/processing circuit will be described in more detail in FIGS. 3–3C. However, let it suffice here to say that the switching/processing circuit 106 routes the formatted data to a processor within the switching/processing circuit 106. The formatted data is then processed within the switching/processing circuit 106 in response to the processing specified in the extended header descriptor. The output of the switching/processing circuit 106 provides the processed data described above. The circuit 106 may be provided as a switching fabric which may be implemented using any one of a variety of techniques including but not limited to bus architecture, crossbar switch, or a cross point switch.

While the switching/processing circuit 106 is shown to be separate from the test instruments 101a–101k, it should be appreciated that in some embodiments it may be desirable or even necessary that all or part of the switching/processing circuit 106 be provided as part of the test instruments 101a–101k. Also, while the switching/processing circuit 106 is shown as part of the support board 23, in another alternate embodiment, the switching/processing circuit is on another circuit board (not shown).

The processed data is transferred on a switching/processing circuit bus 108 to the TCIO circuit 24, whereupon the processed data is transferred on the TCIO bus 20 to the host computer 12. The host computer processes the processed data to provide binned data. In an alternate embodiment, part or all of the binning can be performed by the switching/processing circuit 106, and binned data is transferred to the host computer 12 on the TCIO bus 20.

As described above, the processed data and the binned data often correspond to less data than the measured data. Thus, comparing the exemplary ATE 100 in accordance with the present invention to the prior art ATE 10 of FIG. 1, less data is transferred on the TCIO bus 20 in the direction of the host computer by the ATE 100.

As also described above, a conventional test program used with the prior art ATE 10 of FIG. 1 includes a variety of instructions that can be categorized according to function categories within the test program, the function categories including a) setup, b) execution, c) data move, d) processing, and e) binning.

It should be recognized, however, that in accordance with the present invention, no instructions need be provided that correspond to the data move category. It should also be recognized that no instructions need be provided that correspond to the processing function category. The exemplary ATE 100 provides transfer of the measure data to the switching/processing circuit 106 upon initiation by the measure circuit 38a in combination with the bus master circuit 102a, rather than initiation by the test program 17. With this particular arrangement, it is also not necessary that the test program stop execution to wait for the measure data transfer.

The processing is provided by the switching/processing circuit 106 in response to the extended header descriptor. Information for the extended header descriptor is provided to the test instrument by the test program as part of the setup instructions. It should therefore be recognized that the test program need not provide instructions to process the measure data. Thus, the exemplary ATE 100 can include instructions that can be categorized into fewer function categories within the test program, the function categories including a) setup, b) execution, and c) binning.

It will also be recognized that each of the test instruments, here the test instruments 101a–101k, can transfer at the same time (i.e. simultaneously or concurrently transfer) their respective measure data on respective more data busses 104a–104k to the switching processing circuit 106 for processing.

In one particular embodiment, the move data busses 104a–104k can be provided as high speed parallel data busses each having seven conductors, four of the conductors having data bits, two of the conductors having a differential clock signal, and one of the conductors having a synchronization signal. The formatted data generated by each of the bus master circuits 102a–102k can include a 32 bit by 32-bit header and a 32-bit wide data packet, the data packet corresponding to the measure data. In an alternate embodiment, the move data busses 104a–104k are provided as Ethernet busses and the formatted data is provided as Ethernet format data, both known to one of ordinary skill in the art.

The switching/processing bus 108 can be provided having any high-speed bus architecture.

While test instruments 101a–101k are shown each having respective source memories 32a–32k, source circuits 34a–34k measure memories 36a'–36k', measure circuits 38a'–38k', and bus master circuits 102a–102k, in an alternate embodiment, one or more of the test instruments have only source memories and source circuits or only measure memories, measure circuits, and bus master circuits.

In another alternate embodiment, the measure data provided by the measure circuit, for example, the measure circuit 38*a*', is provided directly to the bus master circuit 102*a* without first being stored in the measure memory 36*a*'. For this alternate embodiment, no measure memory 36*a*' need be provided.

Figure 3A:
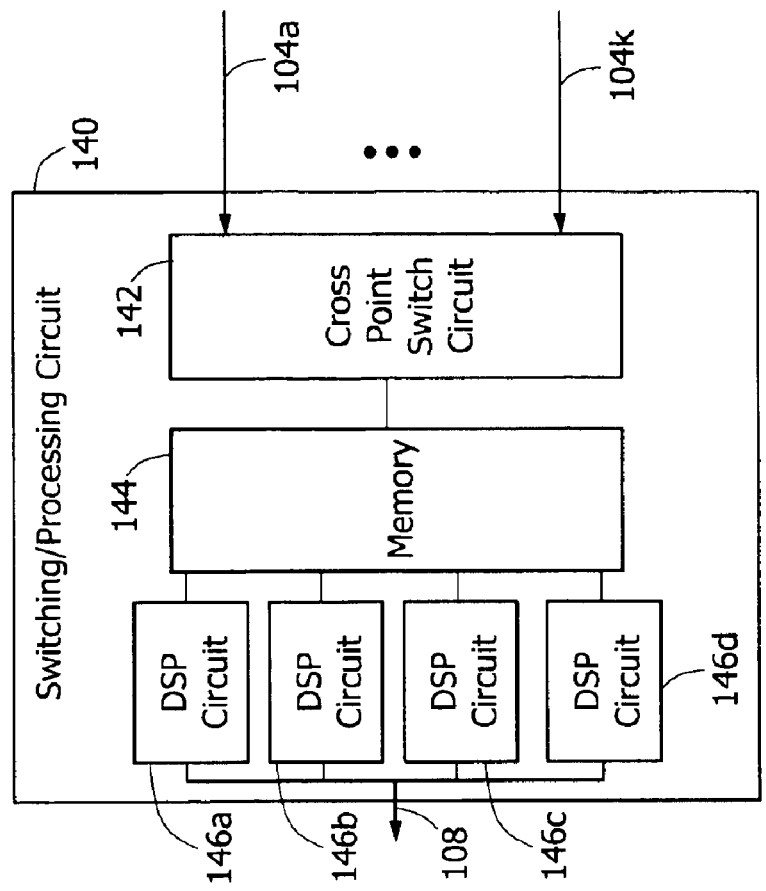
FIG. 3A is a block diagram of another exemplary embodiment of a switching/processing circuit provided as part of the exemplary ATE shown in FIG. 2.
Figure 3:
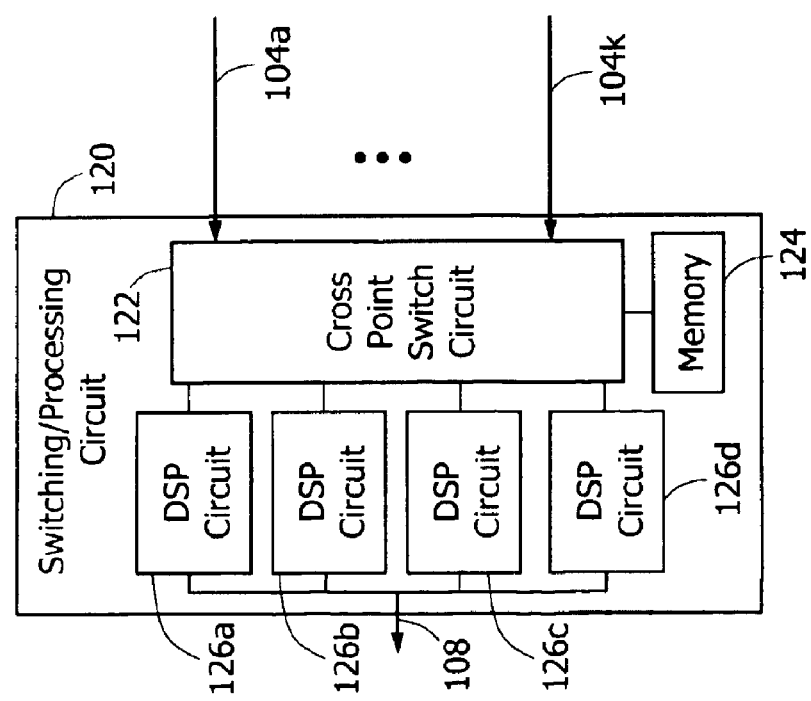
FIG. 3 is a block diagram of an exemplary embodiment of a switching/processing circuit provided as part of the ATE shown in FIG. 2.

Referring now to FIG. 3, in which like elements of FIG. 2 are provided having like reference designations, a first exemplary embodiment of a switching/processing circuit 120 includes a cross point switch circuit 122 coupled to the move data busses 104*a*–104*k*. The cross point switch 122 is also coupled to a memory 124 and to four DSP circuits 126*a*–126*d*. The four DSP circuits 126*a*–126*d* are also coupled to the switching/processing bus 108.

In operation, the cross point switch 122 switches the formatted data carried on one or more of the move data busses 104*a*–104*k* to either the memory 124 or to one or more respective DSP circuits 126*a*–126*d*, (also referred to herein as DSP processors) or to both the memory 124 and to the one or more respective DSP processor 126*a*–126*d*. A DSP processor, for example the DSP processor 126*a*, generates the processed data and provides the processed data on the switching/processor bus 108 to the TCIO circuit 24. The processed data is then transferred to the host computer 12 on the TCIO bus 20 (FIG. 2).

While four DSP processors 126*a*–126*d* are shown in the exemplary embodiment of FIG. 3, it should be recognized that fewer or more than four DSP processor can be used. Having multiple DSP processors, for example, the four DSP processors 124*a*–124*d*, the ATE 100 (FIG. 2) can do parallel processing to enhance the processing speed. The number of DSP processors to use in circuit 120 is selected in accordance with a variety of factors, including, but not limited to, cost, speed, function to be performed, and the application in which this circuit is used. The size, speed and other characteristics of the memory 124 are selected in accordance with a variety of factors including but not limited to cost, speed, and bandwidth.

In an alternate embodiment, in addition to the processing function, the DSP processors 126*a*–126*d* can also provide the binning function, and binned data is provided to the host computer 12.

Referring now to FIG. 3A, in which like elements of FIG. 2 are again provided having like reference designations, a second exemplary embodiment of a switching/processing circuit 140 includes a cross point switch circuit 142 coupled to the move data busses 104*a*–104*k*. The cross point switch 142 is coupled to a memory 144. The memory 144 is coupled to four DSP processors 146*a*–146*d*, which are coupled to the switching/processing bus 108.

In operation, the cross point switch 142 allows formatted data provided by the move data busses 104*a*–104*k* to first be stored in the memory 144. The formatted data stored within the memory 144 is withdrawn from the memory 144 by the DSP processors 146*a*–146*d*. In particular, formatted data corresponding to one or more test instruments (not shown) is withdrawn from the memory 144 by one or more DSP processors. The DSP processors 146*a*–146*d* provide the processed data on the switching/processing bus 108 to the TCIO circuit 24. The size, speed and other characteristics of the memory 144 are selected in accordance with a variety of factors including but not limited to cost, speed, and bandwidth. While four DSP processors 146*a*–146*d* are shown in the exemplary embodiment of FIG. 3A, it should be recognized that fewer or more than four DSP processor can be used. The number of DSP processors to use is selected in accordance with a variety of factors including but not limited to cost, speed, function to be performed, and the application in which this circuit is used.

In an alternate embodiment, in addition to the processing function, the DSP processors 146*a*–146*d* can also provide the binning function, and binned data is provided to the host computer 12.

Figure 3C:
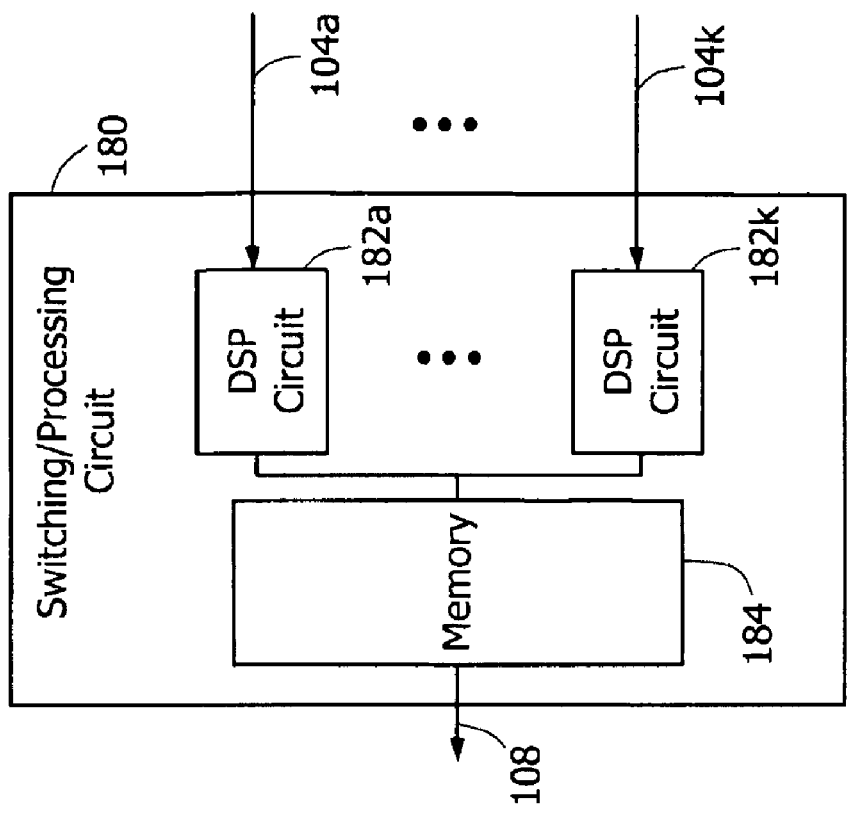
FIG. 3C is a block diagram of yet another exemplary embodiment of a switching/processing circuit provided as part of the exemplary ATE shown in FIG. 2.
Figure 3B:
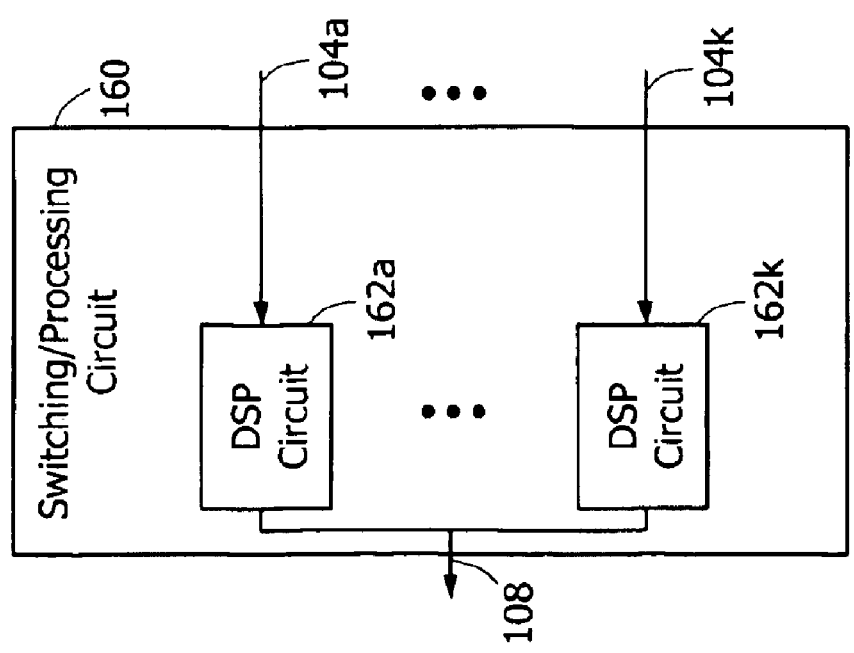
FIG. 3B is a block diagram of yet another exemplary embodiment of a switching/processing circuit provided as part of the exemplary ATE shown in FIG. 2.

Referring now to FIG. 3B, in which like elements of FIG. 2 are again provided having like reference designations, a third exemplary embodiment of a switching/processing circuit 160 includes DSP processors 162*a*–162*k* coupled directly to respective move data busses 104*a*–104*k*. The DSP processors 162*a*–162*k* are also coupled to the switching/processing bus 108.

In operation, the DSP processors 162*a*–162*k* receive measure data directly from the move data busses 104*a*–104*k* and provide the processed data to the switching processing bus 108.

The number of the DSP processors 162*a*–162*k* is selected in accordance with the number of move data busses 104*a*–104*k* coupled thereto, i.e., the number of test instruments. While eleven DSP processors 162*a*–162*k* are shown in the exemplary embodiment of FIG. 3B, it will be appreciated that fewer than or more than eleven DSP processors can be used. The particular DSP characteristics are selected in accordance with a variety of factors including but not limited to cost, speed, function to be performed, and application in which this circuit is used.

In an alternate embodiment, in addition to the processing function, the DSP processors 162*a*–162*k* can also provide the binning function, and binned data is provided to the host computer 12.

Referring now to FIG. 3C, in which like elements of FIG. 2 are again provided having like reference designations, a fourth exemplary embodiment of a switching/processing circuit 180 includes DSP processors 182*a*–182*k*. The DSP processors 182*a*–182*k* are coupled to a memory 184. The memory 184 is coupled to the switching/processing bus 108.

In operation, the DSP processors 182*a*–182*k* receive measure data directly from the move data busses 104*a*–104*k* and provide the processed data to the memory 108. The memory 184 serves as a buffer. The memory 184 then provides the processed data to the switching/processing bus 108.

The number of the DSP processors 182*a*–182*k* is selected in accordance with the number of move data busses 104*a*–104*k* coupled thereto, i.e., the number of test instruments. While eleven DSP processors 182*a*–182*k* are shown in the exemplary embodiment of FIG. 3C, it will be appreciated that fewer than or more than eleven DSP processors can be used. The particular DSP characteristics are selected in accordance with a variety of factors including but not limited to cost, speed, function to be performed, and the application in which this circuit is used. The size, speed and other characteristics of the memory 184 are selected in accordance with a variety of factors including but not limited to cost, speed and bandwidth.

In an alternate embodiment, in addition to the processing function, the DSP processors 182*a*–182*k* can also provide the binning function, and binned data is provided to the host computer 12.

Figure 4:
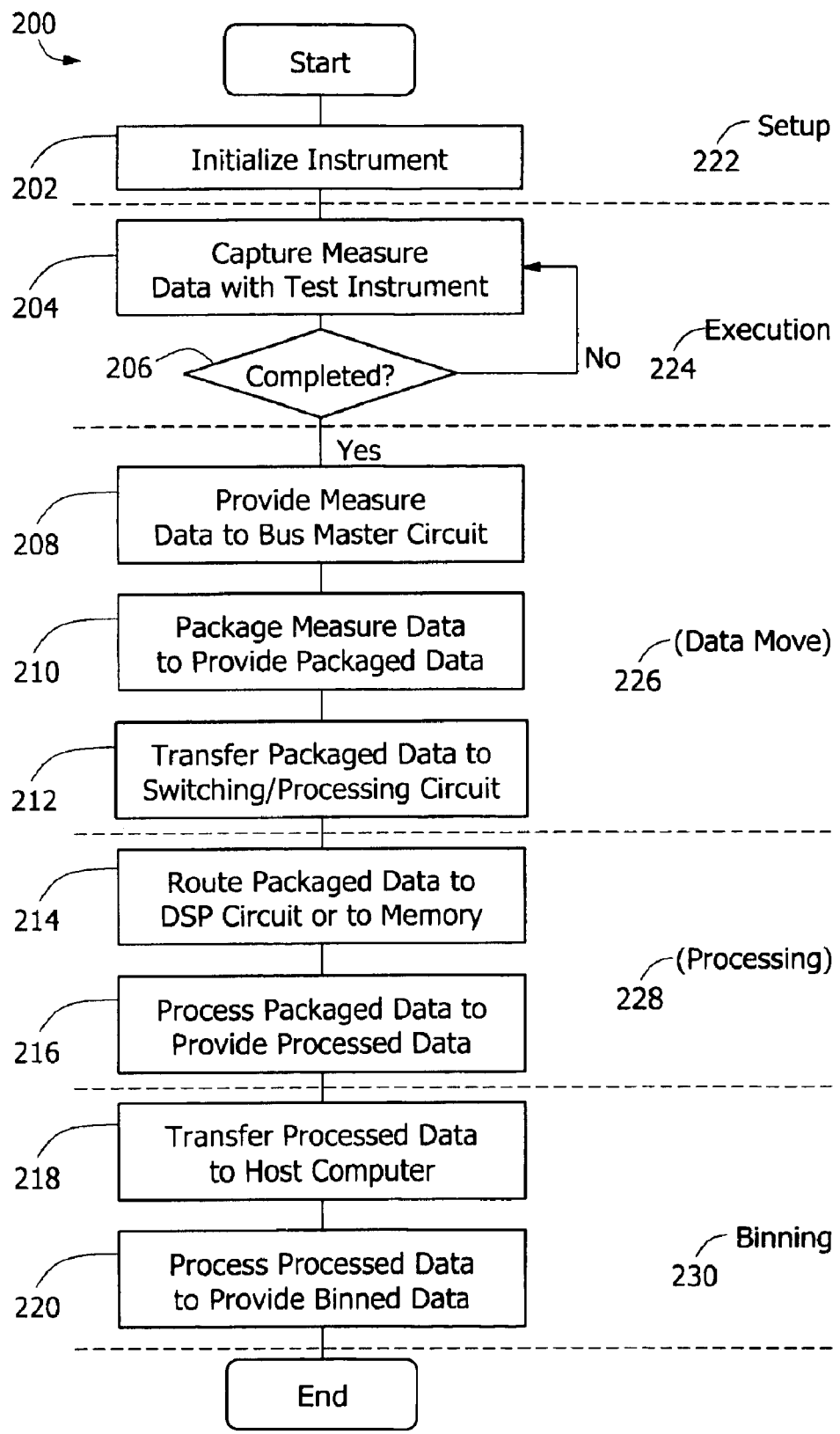
FIG. 4 is a flow chart of an exemplary process for measure data capture and measure data transfer provided in association with the exemplary ATE shown in FIG. 2.

Referring now to FIG. 4, an exemplary process 200 for testing an electronic circuit includes a first step 202 at which one or more test instruments are initialized. As described above, the initialization can include a variety of setup functions, including, but not limited to setup of D/A converters within the source circuit (e.g., 34a, FIG. 2), setup of amplifier gains within the source circuit, setup of filters within the source circuit, setup of A/D converters within the measure circuit (e.g., 38a', FIG. 2), setup of amplifier gains within the measure circuit, and setup of filters within the measure circuit. The step 202 can also include providing source data to the one or more test instruments, the source data converted to one or more source signals by the one or more test instruments as described above.

At step 204, measure data associated with a DUT is captured by a test instrument. As described above, the DUT provides one or more measure signals (e.g., 42a–42d, FIG. 2) in response to one or more source signals (e.g., 40a–40k, FIG. 2). The one or more measure signals are converted by the test instrument (e.g., by the measure circuit 34a'–34k', FIG. 2) to measure data and stored accordingly in one or more measure memories (e.g., the measure memories, 36a'–36k' of FIG. 2).

At step 204, the process waits until all of the measure data associated with the test instrument has been completed. When the measure data has been completely captured, the process continues at step 208.

At step 208, the measure data is provided to a bus master circuit associated with the test instrument that has completed measurement, for example, the bus master circuit 102a of FIG. 2. As described above, the data is provided to the bus master circuit upon initiation by the test instrument, the initiation commencing when the test instrument is ready. It should be recognized that each of the bus master circuits (e.g., 102a–102k, FIG. 2) can be initiated at different times.

At step 210, the measure data is packaged by the bus master circuit, thereby providing packaged data. As described above, the packaged data includes, but is not limited to, a header and a data packet corresponding to the measured data. The header can include a variety of information associated with the data packet, including, but not limited to an extended header descriptor that describes the type of processing that is to be performed upon the data package.

In an alternate embodiment, the packaged data includes only a data packet corresponding to the measure data.

At step 212, the packaged data is automatically transferred by the bus master circuit to a switching/processing circuit. The switching processing circuit is described above in FIGS. 3–3C.

At step 214, the packaged data is routed by the switching/processor circuit either to a DSP processor or to a memory for temporary storage until a processor is free to operate upon the packaged data.

At step 216, the switching/processing circuit processes the packaged data to provide processed data, the processing responsive to the header. As described above, the amount of processed data can be less than the amount of measured data corresponding to the data packet. For example, the measured data can correspond to 1024 samples of a time domain analog signal, the processing can be an FFT, and the output of the processing can correspond to 512 samples of a frequency domain FFT output.

In an alternate embodiment, the type of processing is not responsive to the header, instead being pre-determined. In another alternate embodiment, the type of processing is communicated to the switching processor circuit by a host computer.

At step 218, the processed data is transferred to the host computer. The host computer can be of a type described as the host computer 12 in FIGS. 1 and 2.

At step 220, the host computer processes the processed data to provided binned data. The binned data is provided by a comparison of the processed data to pre-determined thresholds. As described above, the amount of the binned data can be less than the amount of the processed data. For example the processed data can correspond to 512 samples of a frequency domain FFT output, the thresholds can correspond to FFT magnitude thresholds, and the binned data can correspond to one FFT frequency bin value that exceed the pre-determined thresholds.

In another alternate embodiment, the binned data provided at step 220 is generated along with the processed data at step 216 and the binned data is transferred to the host computer at step 218.

As described above, the test program in accordance with this method, and each of the functional steps 202–220, can be categorized according to the function categories of setup 222, execution 224, and binning 230. The function categories of data move 226 and processing 228 are shown parenthetically to indicate that these functions, generated by the test program for a conventional ATE, are instead automatically provided with this invention. It should be appreciated that a subjective decision is made with respect to which steps to include in each of the categories. Thus, each of the categories may include different steps that those shown in FIG. 4. For example, it is possible to consider step 214 as part of the data move category 226 rather than the processing category 228. Similarly, steps 208 and 210 could be considered as part of the execution category 224 rather than as part of the data move category 226.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A circuit testing apparatus, comprising:
   at least one test instrument;
   a bus master circuit coupled to said at least one test instrument, said bus master circuit adapted to receive measure data from said at least one test instrument and, upon initiation from said at least one test instrument, to package the measure data to provide packaged data; and
   a switching/processing circuit coupled to receive the packaged data from said bus master circuit, to process the packaged data to provide processed data, and adapted to communicate the processed data to a host computer.

2. The circuit testing apparatus of claim 1, wherein the packaged data includes:
   a data packet corresponding to the measure data; and
   an extended header descriptor portion of the header associated with the data packet, the extended header descriptor including a processing identifier corresponding to a type of processing to be performed on the data packet.

3. The circuit testing apparatus of claim 1, wherein said switching/processing circuit comprises:

a switching circuit coupled to said bus master circuit and adapted to route the packaged data; and at least one processor coupled to the switching circuit, the at least one processor adapted to receive the packaged data and to process the packaged data to provide the processed data.

4. The circuit testing apparatus of claim 3, wherein the at least one processor is adapted to receive the packaged data and to separate a data packet and an extended header descriptor from the packaged data, the at least one processor further adapted to process the data packet in response to the extended header descriptor to provide the processed data.

5. The circuit testing apparatus of claim 3, wherein said switching/processing circuit further includes a first buffer memory coupled to the switching circuit.

6. The circuit testing apparatus of claim 5, wherein the first buffer memory is coupled to the at least one processor.

7. The circuit testing apparatus of claim 1, wherein said bus master circuit is coupled to a measure memory, the measure memory adapted to receive the measure data from said at least one test instrument and to provide the measure data to said bus master circuit.

8. The circuit testing apparatus of claim 1, wherein the processed data includes binned data.

9. The circuit testing apparatus of claim 1, wherein said bus master circuit and said switching/processing circuit are on separate circuit boards.

10. The circuit testing apparatus of claim 1, wherein said bus master circuit and said switching/processing circuit are on one or more circuit boards included in the at least one test instrument.

11. A method for testing a device under test, comprising:

capturing measure data in a test instrument, the measure data corresponding to one or more functional tests of the device under test performed by the test instrument;

initiating, with the test instrument, operations upon the measure data, the operations including:
  packaging the measure data with a bus master circuit as packaged data; and
  transferring the packaged data to a switching/processing circuit.

12. The method of claim 11, wherein the initiating further includes:
  routing the packaged data to a processor within the switching/processing circuit; and
  processing the packaged data with the processor to provide processed data.

13. The method of claim 12, wherein the packaging includes packaging the measure data with the bus master circuit as packaged data, the packaged data including a data header, and wherein the processing includes processing the packaged data with the processor, the processing responsive to the header.

14. The method of claim 12, wherein the processing comprises:

pre-determining pass and fail thresholds associated with the one or more functional tests; and associating the data packet with the pass and fail thresholds to provide binned data.

15. The method of claim 12, wherein the packaging includes:

generating a data packet corresponding to the measure data; and generating an extended header descriptor associated with the data packet, the extended header descriptor including a processing identifier corresponding to a type of processing to be performed on the data packet.

16. An method of manufacturing an electronic circuit, comprising:

fabricating an electronic circuit; and testing the electronic circuit with a circuit testing apparatus, wherein the testing comprises:
  capturing measure data in a test instrument, the measure data corresponding to one or more functional tests of the electronic circuit performed by the test instrument;
  initiating, with the test instrument, operations upon the measure data, the operations including:
    packaging the measure data with a bus master circuit as packaged data; and
    transferring the packaged data to a switching/processing circuit.

17. The method of claim 16, wherein the initiating further includes:

routing the packaged data to a processor within the switching/processing circuit; and processing the packaged data with the processor to provide processed data.

18. The method of claim 17, wherein the packaging includes packaging the measure data with the bus master circuit as packaged data, the packaged data including a data header, and wherein the processing includes processing, the packaged data with the processor, the processing responsive to the header.

19. The method of claim 17, wherein the processing comprises:

pre-determining pass and fail thresholds associated with the one or more functional tests; and associating the data packet with the pass and fail thresholds to provide binned data.

20. The method of claim 17, wherein the packaging includes:

generating a data packet corresponding to the measure data; and generating an extended header descriptor associated with the data packet, the extended header descriptor including a processing identifier corresponding to a type of processing to be performed on the data packet.

* * * * *

(12) EX PARTE REEXAMINATION CERTIFICATE (8655th)

United States Patent
Viens et al.

(10) Number: US 6,966,019 C1
(45) Certificate Issued: Nov. 8, 2011

(54) INSTRUMENT INITIATED COMMUNICATION FOR AUTOMATIC TEST EQUIPMENT

(75) Inventors: Dominic Viens, Milford, MA (US); Gregory P. Brown, Cambridge, MA (US); Larry Klein, Newton, MA (US); Francois Labonte, Palo Alto, CA (US)

(73) Assignee: Teradyne, Inc., North Reading, MA (US)

Reexamination Request:
No. 90/011,162, Aug. 17, 2010

Reexamination Certificate for:
Patent No.: 6,966,019
Issued: Nov. 15, 2002
Appl. No.: 10/186,195
Filed: Jun. 28, 2002

(51) Int. Cl.
*G01R 31/317* (2006.01)

(52) U.S. Cl. ........................................ 714/724
(58) Field of Classification Search ........................ None
See application file for complete search history.

(56) References Cited

To view the complete listing of prior art documents cited during the proceeding for Reexamination Control Number 90/011,162, please refer to the USPTO's public Patent Application Information Retrieval (PAIR) system under the Display References tab.

*Primary Examiner* — Mark Sager

(57) ABSTRACT

An automatic test system transfers measure data from one or more test instruments to a processor and processes the measure data, the packaging, transfer, and the processing of the measure data initiated by the one or more test instruments. A method for testing a device under test includes capturing measure data with a test instrument, and initiating, with the test instrument, operation upon the measure data. The operations include packaging the measure data to provide packaged data, and transferring the packaged data to a switching/processing circuit for processing. A method of manufacturing an electronic circuit includes fabricating the electronic circuit and testing the electronic circuit with the aforementioned method.

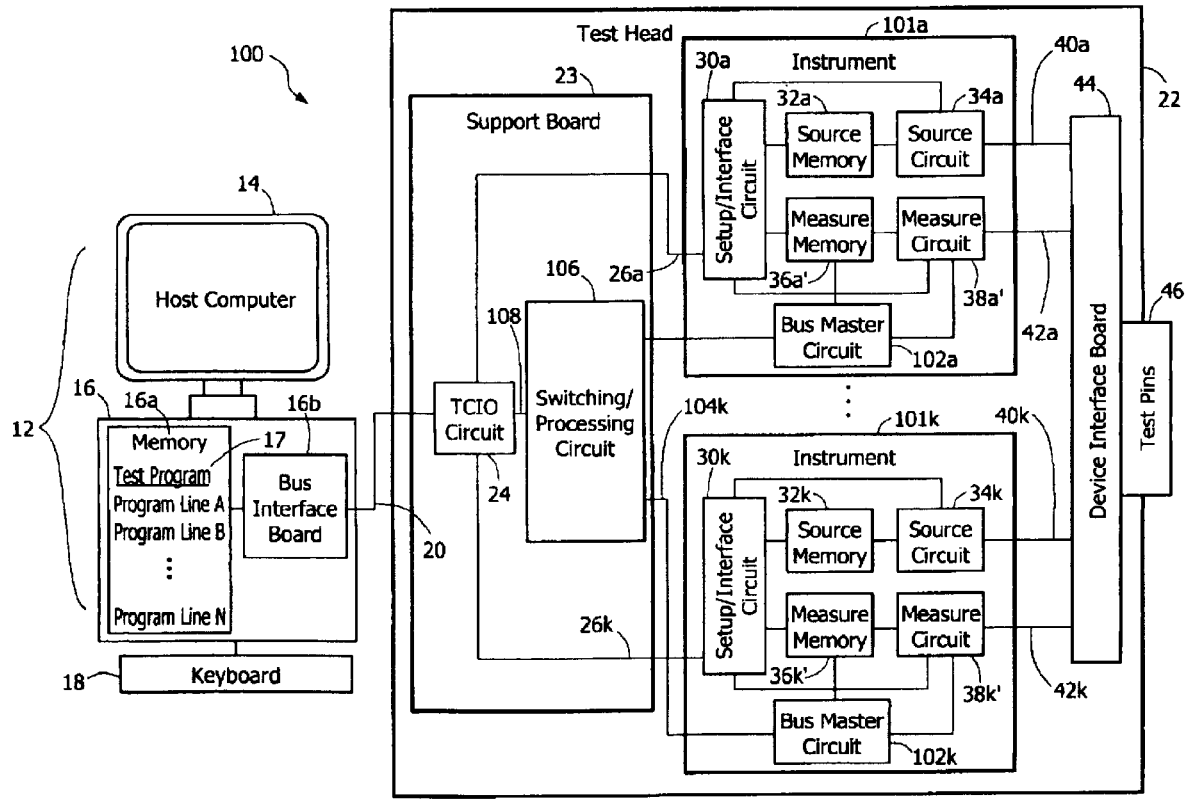

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1 and 11 is confirmed.

New claims 21-42 are added and determined to be patentable.

Clains 2-10 and 12-20 were not reexamined.

21. The circuit testing apparatus of claim 1, wherein the switching/processing circuit includes a plurality of processing units capable of processing data received from the bus master circuit in parallel.

22. The circuit testing apparatus of claim 21, wherein the processing units each include a digital signal processor (DSP), and wherein the DSPs process data in parallel.

23. The circuit testing apparatus of claim 1, wherein the test instrument, the bus master circuit, and switching/processing circuit are formed on one test head.

24. The circuit testing apparatus of claim 1, wherein the packaged data is packaged in a format for Ethernet, and wherein the bus master circuit is coupled to the switching/processing circuit with an Ethernet bus.

25. The circuit testing apparatus of claim 1, wherein the apparatus includes a plurality of test instruments and bus master circuits, the apparatus further including a single host computer coupled to the switching/processing circuit, and a plurality of buses coupled between the switching/processing circuit and the bus master circuits.

26. The circuit testing apparatus of claim 1, wherein the test instrument has an interface that is responsive to a test program on a host computer, wherein the test instrument includes a measure circuit, wherein the bus master circuit transfers the measure data when a measurement has completed and without requiring an instruction from the host computer in order to cause the measure data to be transferred.

27. The circuit testing apparatus of claim 26, wherein the test instrument includes a measure memory for storing measure data, the bus master circuit causing measure data in the measure memory to be packaged and transferred.

28. The circuit testing apparatus of claim 1, wherein the switching/processing circuit includes a plurality of digital signal processor (DSP), each of which is capable of receiving packaged data from the bus master circuit, and wherein the DSPs can process data from multiple bus master circuits in parallel.

29. The circuit testing apparatus of claim 1, wherein the packaged data includes measure data and a header.

30. The circuit testing apparatus of claim 29, wherein the header includes information identifying the particular test instrument, and information indicating an amount of measure data being sent.

31. The circuit testing apparatus of claim 29, wherein the header includes a source address and a destination address.

32. The method of claim 11, wherein the transferring includes transferring to a plurality of processing units, each of which is capable of processing data received from the bus master circuit.

33. The method of claim 32, wherein the processing units each include a digital signal processor (DSP), the DSPs processing data from bus master circuits in parallel.

34. The method of claim 11, wherein the packaging includes packaging the measure data in a format for Ethernet, wherein the bus master circuit transfers packaged data to the switching/processing circuit over an Ethernet bus.

35. The method of claim 11, wherein the test instrument has an interface that is responsive to a test program on a host computer, wherein the bus master circuit transfers the measure data when a measurement has completed and without requiring an instruction from the host computer in order to cause the measure data to be transferred when the data is ready for transfer.

36. The method of claim 35, wherein the test instrument includes a measure memory for storing measure data, the bus master circuit causing measure data in the measure memory to be packaged with a data portion and a header portion, and causes the packaged data to be transferred.

37. The method of claim 11, wherein the switching/processing circuit includes a plurality of digital signal processor (DSP), wherein the DSPs each receive packaged data from the bus master circuit, wherein the DSPs process data from multiple bus master circuits in parallel.

38. The method of claim 11, wherein the packaging includes packaging data in packets, each packet having measure data and a header.

39. The method of claim 38, wherein the packaging includes providing a header that includes information identifying the particular test instrument, and information indicating an amount of measure data being sent.

40. The method of claim 38, wherein the packaging includes providing a header that includes a source address and a destination address.

41. The circuit testing apparatus of claim 32, wherein the switching/processing circuit includes a cross point switch coupled between the bus master circuit and the plurality of processing units.

42. The method of claim 33, wherein the transferring includes transferring to a cross point switch, from where the packaged data is provided to one of the plurality of processing units.

* * * * *